US006541063B1

(12) United States Patent
Prentice et al.

(10) Patent No.: US 6,541,063 B1
(45) Date of Patent: Apr. 1, 2003

(54) CALIBRATION OF A DISPENSING SYSTEM

(75) Inventors: Thomas C. Prentice, Westford, MA (US); Brian P. Prescott, Fremont, NH (US)

(73) Assignee: Speedline Technologies, Inc., Haverhill, MA (US)

( * ) Notice: Subject to any disclaimer, the term of this patent is extended or adjusted under 35 U.S.C. 154(b) by 44 days.

(21) Appl. No.: 09/705,080

(22) Filed: Nov. 2, 2000

Related U.S. Application Data
(60) Provisional application No. 60/163,517, filed on Nov. 4, 1999.

(51) Int. Cl.⁷ ............................................... B05D 5/00
(52) U.S. Cl. ............................ 427/8; 427/96; 427/256; 427/287; 427/421; 118/712; 118/323; 222/61; 222/420; 239/227; 239/751
(58) Field of Search ........................ 427/8, 256, 287, 427/421, 96; 118/712, 323; 222/61, 420; 239/751, 227

(56) References Cited

U.S. PATENT DOCUMENTS

| 3,828,869 A | 8/1974 | Sellers ........................ 177/50 |
| 3,994,256 A | 11/1976 | Moen ............................ 118/3 |
| 4,038,531 A | 7/1977 | Loe, Jr. .................... 235/151.1 |
| 4,054,784 A | 10/1977 | Ricciardi et al. ........... 364/479 |
| 4,095,723 A | 6/1978 | Lerner ........................ 222/56 |
| 4,234,102 A | 11/1980 | Spurgeon ..................... 222/55 |
| 4,271,092 A | 6/1981 | Sullivan et al. ............... 261/30 |
| 4,330,354 A | 5/1982 | Deubner et al. ............. 156/352 |
| 4,345,858 A | 8/1982 | Barlow ........................ 406/34 |
| 4,406,247 A | 9/1983 | Baughman et al. ......... 118/684 |
| 4,431,690 A | 2/1984 | Matt et al. .................... 427/1 |
| 4,467,844 A | 8/1984 | Di Gianfilippo et al. ........ 141/1 |
| 4,470,369 A | 9/1984 | Edgerton ................... 118/723 |
| 4,580,698 A | 4/1986 | Ladt et al. ..................... 222/55 |
| 4,589,372 A | 5/1986 | Smith ....................... 119/51 R |
| 4,620,893 A | 11/1986 | Parrens ...................... 156/345 |
| 4,666,732 A | 5/1987 | Schucker ...................... 427/8 |
| 4,667,852 A | 5/1987 | Siemann ..................... 222/54 |
| 4,682,710 A | 7/1987 | Turner, Jr. et al. ........... 222/63 |
| 4,682,711 A | 7/1987 | Reighard et al. ............. 222/75 |
| 4,787,332 A | 11/1988 | Geisel et al. ............... 118/692 |
| 4,796,782 A | 1/1989 | Wales et al. .................. 222/57 |
| 4,878,522 A | 11/1989 | Ostrander .................... 141/1.1 |
| 4,891,249 A | 1/1990 | McIntyre ..................... 427/421 |
| 4,893,262 A | 1/1990 | Kalata ........................ 364/567 |
| 4,913,198 A | 4/1990 | Hayahara et al. ............. 141/83 |
| 4,935,261 A | 6/1990 | Srivastava et al. ........... 427/10 |
| 4,967,933 A | 11/1990 | Maiorca et al. ................ 222/1 |
| 4,987,854 A | 1/1991 | Hall .......................... 118/679 |
| 5,042,688 A | 8/1991 | Srivastava et al. ............ 222/55 |

(List continued on next page.)

FOREIGN PATENT DOCUMENTS

WO  WO 97/13586  4/1997

OTHER PUBLICATIONS

PCT International Search Report dated Feb. 20, 2001.

*Primary Examiner*—Katherine A. Bareford
(74) *Attorney, Agent, or Firm*—Mintz, Levin, Cohn, Ferris, Glovsky and Popeo, P.C.

(57) ABSTRACT

The present invention is directed to methods and apparatus for controlling the quanatity of material dispensed from dispensing systems. In one aspect of the present invention, a dispensing system includes a weight scale upon which material is dispensed from a dispensing system during a calibration routine. The weight of the dispensed material is determined and compared with a target weight. If the weight of the dispensed material varies from the target weight by more than a predetermined amount, then characteristics of the dispensing system are adjusted, and the calibration routine is repeated.

8 Claims, 2 Drawing Sheets

U.S. PATENT DOCUMENTS

| | | | |
|---|---|---|---|
| 5,052,338 A | 10/1991 | Maiorca et al. | 118/668 |
| 5,065,695 A | 11/1991 | Baron et al. | 118/688 |
| 5,110,615 A | 5/1992 | Maiorca et al. | 427/8 |
| 5,116,634 A | 5/1992 | Havens et al. | 427/4 |
| 5,148,841 A | 9/1992 | Graffin | 141/83 |
| 5,175,018 A | 12/1992 | Lee et al. | 427/8 |
| 5,208,064 A | 5/1993 | Becker et al. | 427/8 |
| 5,263,608 A | 11/1993 | Kiernan et al. | 222/1 |
| 5,271,521 A | 12/1993 | Noss et al. | 222/1 |
| 5,320,250 A | 6/1994 | La et al. | 222/1 |
| 5,322,706 A | 6/1994 | Merkel et al. | 427/8 |
| 5,332,125 A | 7/1994 | Schmitkons et al. | 222/1 |
| 5,348,604 A | 9/1994 | Neff | 156/272.8 |
| 5,375,634 A | 12/1994 | Egger | 141/83 |
| 5,377,868 A | 1/1995 | Hernandez et al. | 222/1 |
| 5,413,154 A | 5/1995 | Hurst, Jr. et al. | 141/83 |
| 5,423,455 A | 6/1995 | Ricciardi et al. | 222/1 |
| 5,423,456 A | 6/1995 | Arendonk et al. | 222/54 |
| RE35,010 E | 8/1995 | Price | 222/1 |
| 5,437,727 A | 8/1995 | Yoneda et al. | 118/669 |
| 5,465,879 A | 11/1995 | La et al. | 222/189.06 |
| 5,487,603 A | 1/1996 | Hoff et al. | 366/141 |
| 5,505,777 A * | 4/1996 | Ciardella et al. | 118/663 |
| 5,510,149 A | 4/1996 | Schucker | 427/421 |
| 5,515,888 A | 5/1996 | Graffin | 141/1 |
| 5,523,101 A | 6/1996 | Fitch, Jr. | 426/289 |
| 5,554,224 A | 9/1996 | Foltyn | 118/725 |
| 5,558,504 A | 9/1996 | Stridsberg | 417/322 |
| 5,570,731 A | 11/1996 | Muscara | 141/83 |
| 5,632,411 A | 5/1997 | Harty et al. | 222/1 |
| 5,636,118 A | 6/1997 | Brewster et al. | 395/229 |
| 5,665,941 A | 9/1997 | Wehhofer et al. | 177/25.13 |
| 5,711,989 A | 1/1998 | Ciardella et al. | 427/96 |
| 5,718,268 A | 2/1998 | Muscara | 141/87 |
| 5,837,892 A | 11/1998 | Cavallaro et al. | 73/149 |
| 5,857,589 A | 1/1999 | Cline et al. | 222/1 |
| 5,906,682 A * | 5/1999 | Bouras et al. | 118/712 |
| 5,978,093 A | 11/1999 | Abrahamson | 356/401 |

* cited by examiner

CALIBRATION OF A DISPENSING SYSTEM

RELATED APPLICATION

This application claims priority to U.S. Provisional Application No. 60/163,517, filed Nov. 4, 1999, which is incorporated by reference herein.

FIELD OF THE INVENTION

The present invention relates generally to a method and apparatus for controlling the operation of a liquid dispensing system, and more particularly, to a method and apparatus for measuring and controlling the amount of viscous material dispensed from a dispensing system.

BACKGROUND OF THE INVENTION

There are several types of prior art dispensing machines used for dispensing metered amounts of liquid or paste for a variety of applications. One such application is in the assembly of surface mount printed circuit boards, wherein adhesive liquid is dispensed in precise, predetermined locations on a circuit board. The adhesive liquid is used for connecting components to the circuit board. Another application of dispensing machines is in dispensing viscous material used for encapsulating integrated circuit chips and/or for under filling flip integrated circuit chips. The dispensing machines are generally required to run continuously to achieve a high throughput, and are also required to achieve a high degree of accuracy and repeatability (i.e., be able to dispense substantially identical dots with a very small tolerance or variability between dots). The dispensing systems described above include those manufactured by Speedline Technologies, Inc., the assignee of the present invention, and distributed under the name XYFLEX™.

As semiconductor packaging technology advances, so too does the need for better and more accurate fluid dispensing technology to support this application. Manufacturers who use dispensing systems to encapsulate and underfill any of a variety of semiconductor packages demand ever more accurate and repeatable means for controlling the dispensing process. In one prior art dispensing system, the weight of material dispensed by the system is periodically measured by a scale during calibration routines, and the dispensing system includes a feedback system to adjust the quantity of fluid dispensed by the dispensing system, so that the weight of the material dispensed is controlled.

In some prior art dispensing systems, such as that disclosed in U.S. Pat. No. 5,906,682 to Bouras et. al, which is incorporated herein by reference, the addition of a weight scale to the dispensing process improves the accuracy and repeatability of the process by measuring the actual material flow rate being achieved, and adjusting the dispenser's traverse speed as necessary to compensate for any long term variations. Inherent in this approach is the assumption that the flow rate is constant over the short term. However, in reality, fluid flow is seldom constant. Certainly the steady state material delivery rate cannot be achieved instantaneously, nor can the positioning system be accelerated or decelerated instantaneously. These nonlinear transitions result in discrepancies between predicted and actual material amounts. In embodiments of the present invention, to overcome these shortcomings, a different approach has been taken; the presence of these nonlinearities is acknowledged and their effects is captured by duplicating them during weight scale sample dispensing.

SUMMARY OF THE INVENTION

In one aspect, the present invention is directed to a system for dispensing material onto a substrate. The system includes a positioning system, a dispensing element coupled to the positioning system to move the dispensing element over the substrate to dispense material on the substrate in a predetermined pattern, the dispensing element having a metering device that controls a quantity of material that is dispensed from the dispensing element, a calibration device that receives material from the dispensing element during a calibration routine of the dispensing system, and a controller, coupled to the positioning system, the dispensing element and the calibration device to control operation of the system, wherein the controller is constructed and arranged to control the positioning system and the dispensing element such that the dispensing element is moved and controlled according to a calibration pattern to dispense material onto the calibration device during a calibration routine, and wherein the calibration pattern is representative of the predetermined pattern.

The system may be constructed and arranged such that movement of the positioning system is coordinated with dispensing from the dispensing element to provide a substantially uniform line of dispensed material on the substrate. The calibration device may be constructed and arranged to determine a quantity of material dispensed during a calibration routine, and the quantity may be compared with a target quantity of material to determine an error value. The controller may be constructed and arranged to apply a scale factor to the predetermined pattern to obtain the calibration pattern to reduce the distance traveled by the pump during the calibration routine to maintain the pump over the calibration device. The scale factor may be applied to the speed of movement of the dispensing system during a calibration routine such that the material dispensed during a calibration routine is substantially the same as that dispensed onto a substrate. The system may be constructed and arranged to adjust a rate of delivery of the metering device when the error value is greater than a predefined value. The system may be constructed to adjust a speed of movement of the pump when the error value is greater than a predefined value.

Another aspect of the present invention is directed to a method of calibrating a dispensing system that dispenses material onto a substrate according to a predetermined pattern, the dispensing system having a dispensing pump that dispenses material and a gantry system that controls movement of the pump over the substrate and over a calibration system. The method includes steps of (a) moving the pump over the calibration system, (b) dispensing a quantity of material from the pump while the pump is moved by the gantry system according to a calibration pattern that is representative of the predetermined pattern, (c) determining the quantity of material dispensed, (d) comparing the quantity of material dispensed with a target quantity, and (e) adjusting characteristics of the dispensing system when a difference between the quantity of material dispensed and the target quantity is greater than a predetermined tolerance. Steps (a) through (e) may be repeated prior to dispensing on a substrate until the difference is less than the tolerance. The method may further include a step of applying a scaling factor to the predetermined pattern to reduce the distance traveled by the pump to maintain the pump over the calibration system during a calibration routine. The scaling factor may be applied to the gantry system to reduce the speed of movement of the pump during a calibration routine such that the material dispensed during a calibration routine is substantially the same as that dispensed onto a substrate.

Another aspect of the present invention is directed to a system for dispensing a material onto a substrate. The system includes a positioning system, a dispensing element coupled to the positioning system to move the dispensing element over the substrate to dispense material on the substrate in a predetermined pattern, the dispensing element having a metering device that controls a quantity of material that is dispensed from the dispensing element, a calibration device that receives material from the dispensing element during a calibration routine of the dispensing system, means for moving the dispensing element according to a calibration pattern that is representative of the predetermined pattern to dispense material onto the calibration device during a calibration routine, and means for determining a quantity of material dispensed during a calibration routine.

The system may further include means for determining a difference between the quantity of material dispensed with a target quantity, and means for adjusting characteristics of the system to reduce the difference.

Yet another aspect of the present invention is directed to a method of calibrating a dispensing system that dispenses material onto a substrate according to a predetermined pattern, the dispensing system having a dispensing pump that dispenses material and a gantry system that controls movement of the pump over the substrate and over a calibration system. The method includes steps of (a) moving the pump over the calibration system, (b) dispensing a quantity of material from the pump while the pump is held at a fixed position over the calibration system and the pump is controlled to follow a dispensing calibration pattern that is representative of a dispensing pattern of the pump for the predetermined pattern, (c) determining the quantity of material dispensed, (d) comparing the quantity of material dispensed with a target quantity, and (e) adjusting characteristics of the dispensing system when a difference between the quantity of material dispensed and the target quantity is greater than a predetermined tolerance.

BRIEF DESCRIPTION OF THE DRAWINGS

For a better understanding of the present invention, reference is made to the drawings which are incorporated herein by reference and in which.

DETAILED DESCRIPTION

For purposes of illustration only, and not to limit generality, the present invention will now be explained with reference to a dispensing system used to dispense an adhesive, solder paste, an encapsulent or some other media onto a substrate such as a circuit board or an integrated circuit chip. One skilled in the art will appreciate, however, that embodiments of the present invention are not limited to dispensing systems, but rather, the measuring and control apparatus in accordance with embodiments of the present invention may be used in other applications requiring precise, weight or volume measurements of small quantities of viscous materials.

Figure 1:
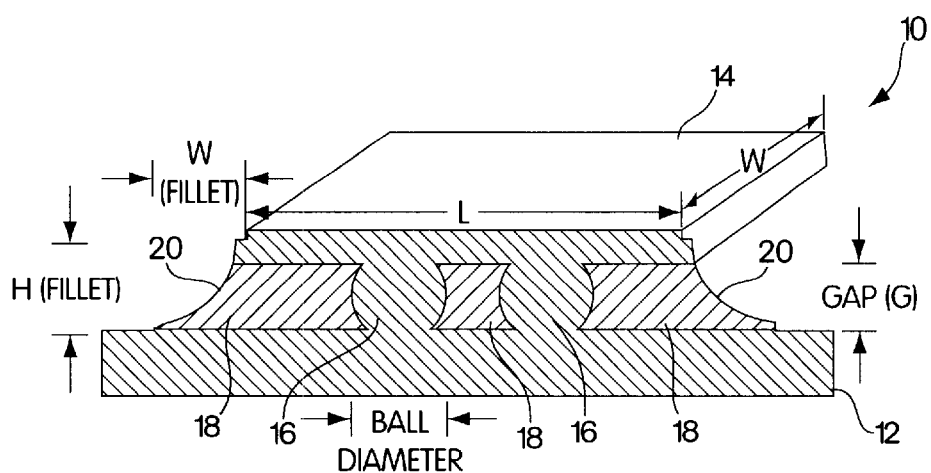
FIG. 1 is a cross-sectional view of a flip chip integrated circuit.

FIG. 1 shows a cross-sectional view of a flip chip integrated circuit 10 having a base 12 and a die 14. A number of solder balls 16 are disposed between the base and the die of the integrated circuit to provide electrical connections between the die and the base. Underfill material 18 is disposed in the gap between the die 14 and the base 12 around all of the balls 16, and a fillet of underfill material 20 is disposed on the base around the perimeter of the die 14. To provide the underfill material to a flip chip integrated circuit, it is known to lower a pump of a dispensing system in close proximity to the flip chip integrated circuit, and to dispense underfill material from a dispensing needle of the pump onto the substrate as the pump is moved around the perimeter of the flip chip. The dispensed underfill material will then seep under the flip chip.

The total volume V of underfill material required to properly fill the gap and provide the fillet around the perimeter of the die can be determined using equation (1) below:

$$V = Vc - Vb + Vf \qquad \text{Equation 1}$$

where:

Vc=the volume of the gap between the die and the base;

Vb=the total volume of all the solder balls; and

Vf=the volume of the fillet.

In one typical application, Vc is approximately equal to 22.58 mm$^3$, Vb is approximately equal to 0.30$^3$, and Vf is approximately equal to 0.50 mm$^3$, so that the total volume V of underfill material is equal to approximately 22.78 mm$^3$. For the typical application described above, to properly underfill the integrated circuit 10, it is desirable to dispense precisely 22.78 mm$^3$ of underfill material from a dispensing system. This desired volume may be converted to a desired weight by multiplying by the material's density. Weight and volume calibration systems have been incorporated into prior art dispensing systems to periodically calibrate the dispensing system to ensure that the proper amount of material is being dispensed.

In one prior art dispensing system, the weight of material dispensed is determined for a fixed period of time, and a dispense rate (in terms of weight per unit time) is determined. For example, the operator of a dispensing system sets up a sample dispense routine as N shots, of M seconds each, with P seconds of pause between shots (e.g. 15 shots of 1 sec each, with 0.5 sec pauses (parameter names are mine). The total amount dispensed is weighed and divided by the total on time of the pump (e.g. 187.5 mg/15 sec=12.5 mg/sec). This measurement is then used to calculate other control parameters for the dispenser. For example, since the system "knows" the target weight of the pattern to be dispensed (e.g. 100 mg), the on time of the valve may be determined. (e.g. 100 mg/(12.5 mg/sec)=8 sec). Furthermore, since the distance to be traversed is known (e.g. 20 mm), the average traverse rate can be calculated (e.g. 20 mm 18 sec=2.5 mm/sec). This value can then be used to control the gantry speed and therefore the speed at which the pump traverses the perimeter of the flip chip.

One problem of the above-described system is that it fails to account for non-linearities in the dispense rate and the gantry speed that occur as the pump and the movement of the gantry are started and stopped. This problem is particularly significant for encapsulent dispensing of flip chips, wherein both the pump and the gantry are started and stopped a number of times as the pump is traversed around the perimeter of the flip chip. During flip chip dispensing, the pump may never reach the full dispense rate, and the gantry may never reach the full traverse speed. Embodiments of the present invention, which will now be described, provide dispensing systems having novel calibration systems that overcome these problems with the prior art.

Figure 2:
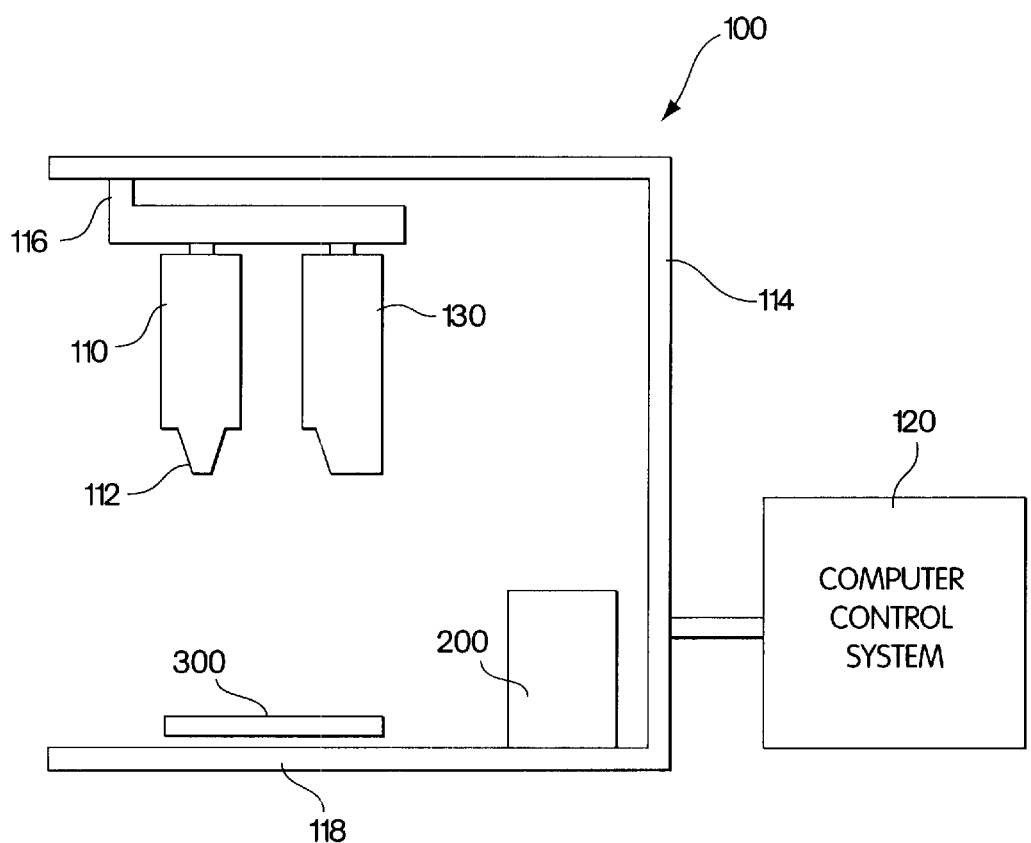
FIG. 2 is a drawing of a dispensing system in accordance with one embodiment of the present invention.

FIG. 2 shows a liquid dispensing system 100 in accordance with one embodiment of the present invention for dispensing materials including underfill material. The liquid dispensing system 100 includes a pump and dispenser assembly 110, a computer control system 120, a vision system 130, and a weight measuring apparatus 200. The liquid dispensing system 100 has a frame 114 having a lower base 118 for supporting a circuit board 300 or some other substrate that is to receive drops of material dispensed by the pump and dispenser assembly 110. The pump and dispenser assembly 110 and the vision system 130 are coupled to an arm 116 which in turn is movably coupled to the frame 114 of the dispensing system 100. The arm 116 can be moved, using motors (not shown), under the control of the computer control system, in X, Y and Z directions, to locate the pump and dispenser assembly 110 and the vision system 130 at predetermined locations and heights over the circuit board 300 and the weight measuring apparatus 200.

The dispensing system 100 operates as follows. The circuit board 300, or some other substrate that is to receive material dispensed from the dispensing system, is placed on the base 118 of the dispensing system. The circuit board 300 may be placed on the base manually, or in a preferred embodiment, a conveyor system is used for loading circuit boards or other substrates into the dispensing system 100. The base 118 may also include a vacuum lift table for securing the board 300 to the base 118 during the dispensing operation, and may also include a heater to maintain the circuit board and dispensed material at a desired temperature.

The pump and dispenser assembly 110 dispenses drops and/or patterns of material through a nozzle 112 at predetermined points on the circuit board 300. The dispensing material is stored in a container (not shown), coupled to the pump and dispenser assembly, at a constant pressure and temperature. In a preferred embodiment, the pump and dispenser assembly includes a rotary type pump having a metering device that includes an auger within an auger chamber. The auger is precisely turned within the auger chamber to dispense metered quantities of liquid. The quantity of material dispensed for a given rotary type pump is controlled by setting the revolutions per minute (RPM) of the auger and the dispensing time of the pump. In one embodiment of the present invention, the auger and auger chamber are implemented as described in U.S. Pat. No. 5,819,983 entitled "Liquid Dispensing System With Improved Sealing Augering Screw and Method For Dispensing", assigned to the assignee of the present invention, and incorporated herein by reference. In other embodiments, other pumps may be used, such as those described in U.S. Pat. No. 5,957,343, and U.S. patent application Ser. No. 09/483,360, both of which are assigned to the assignee of the present application and incorporated herein by reference.

The computer control system 120 controls motors (not shown) to move the arm 116 in the X, Y, and Z directions to properly position nozzle 112 of the pump and dispenser assembly 110 over the circuit board to ensure that dispensing occurs at the predetermined points on the circuit board. In one embodiment a well-known X-Y gantry system is used to control the position of the pump in the X-Y plane. In other embodiments, other gantry systems, such as those described in U.S. Pat. No. 5,886,494 entitled Positioning System, which is incorporated herein by reference, may be used. The computer control system is pre-programmed with a desired material dispense pattern for the 10 circuit board and may contain programs for depositing drops on several different types of circuit boards or other substrates in addition to the flip chip integrated circuit substrate discussed above.

The vision system 130 is used for providing proper alignment of the pump and dispenser 110 with the circuit board 300 prior to the dispensing of drops onto the circuit board. The vision system 130 locates fiducial points, chips, chip edges or other recognizable patterns on the circuit board in order to properly align the pump and dispenser assembly with the circuit board. The vision system may also used after dispensing has occurred to inspect the material that has been deposited onto the circuit board (or some other substrate) to ensure that the proper amount of material has been deposited, and to ensure that the material has been deposited at the proper locations on the circuit board.

Figure 3:
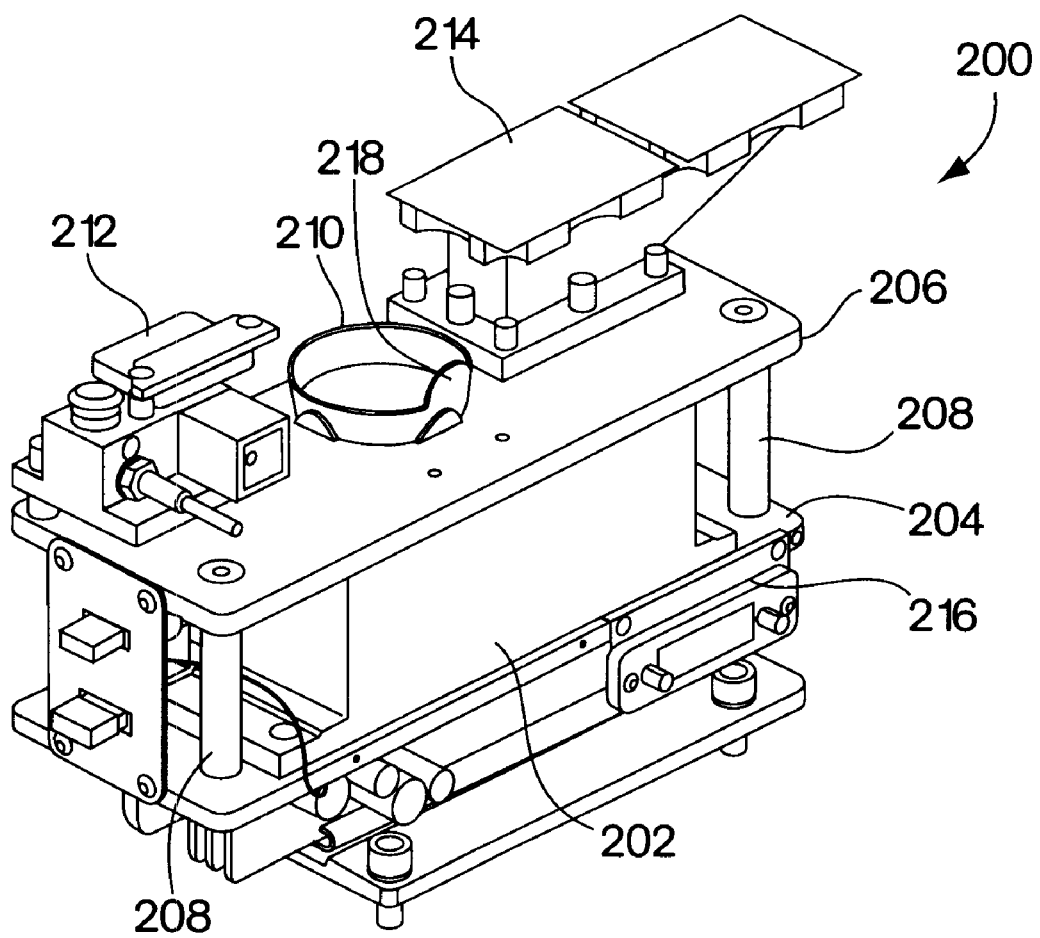
FIG. 3 is a perspective view of an apparatus used to measure weight of dispensed material in the dispensing system of FIG. 2.

The weight measuring apparatus 200 used in one embodiment of the present invention is shown in greater detail in FIG. 3. The weight measuring apparatus includes a weigh scale module 202 mounted between a bottom plate 204 and a top plate 206. Standoffs 208 support the top plate 206 above the bottom plate 204. A weighing dish 210 is coupled to the weighing module through a hole (not shown) in the top plate 206. The weighing dish is isolated from the top plate 206. Mounted on the top plate 206 are a needle calibration assembly 212 and a pre-dispense station 214.

The needle calibration assembly is used to calibrate the height of the needle tip to allow the dispensing system to adjust the tip of the needle to the proper height above a substrate for dispensing. The pre-dispense assembly provides a surface onto which material may be dispensed from the pump during, for example, initial calibration and set-up.

In one embodiment of the present invention, the weigh scale module 206 is implemented using model no. XX46-0001 available from Sartorius of Edgewood N.Y. The weigh scale module has an electrical connector 216 for coupling to the computer control system to provide weight signals to the computer control system.

During a calibration routine of dispensing systems of the present invention, material is dispensed into the weighing dish, the weigh scale module determines the weight of the material dispensed and the weigh scale module communicates electrical signals representative of the weight measured to the computer control system. In one embodiment, the weighing dish has a tab 218 that is used as a handle to lift the dish from the system for cleaning. In another embodiment, the dish has a raised center portion (not shown). In this embodiment, the dispensing system may move the needle past the center portion to cause any tail of material on the needle to be captured in the dish for measurement.

In one embodiment of the present invention, the dispensing pump is driven as a fully servoed axis. This allows coordination of the pump auger rotation with the traverse motion of the dispenser valve positioning system. For example, during the dispensing of material around the perimeter of a flip chip, as the gantry accelerates out of a turn, so too does the pump. In this manner, a controlled material amount per distance traveled can be provided.

In embodiments of the present invention, the ratio of pump auger rotation to the horizontal distance traversed is defined as "Line Width", and this ratio is represented in units of degrees of auger rotation per distance travelled (e.g. deg/mm). In other embodiments of the present invention, pumps other than auger pumps, such as piston pumps or other positive displacement pumps, may be used. In these embodiments, the concept of line width may be more broadly defined as the ratio of rate of dispensing per distance traveled.

To control the amount of material dispensed, in embodiments of the present invention, an entire dispensing pattern is used during a calibration routine. Rather than measuring a dispense rate and extrapolating this rate to predict a pattern weight, as is done in the prior art, in embodiments of the present invention, the entire pattern is weighed and compared with the target weight. In this manner, all of the nonlinear effects of starts and stops of the pump and the gantry system are accounted for in any calibration weight measurements. Finally, when adjustments are made to compensate for dicrepancies between measured and desired target weights, it is the line width ratio that is varied. It should be noted, that in some embodiments of the present invention, the maximum RPM of the auger is limited, and therefore, the maximum traverse speed is varied to cause the desired target weight to be dispensed. If the maximum traverse speed were limited instead, the maximum RPM could be varied to control the weight dispensed. Alternatively, in other embodiments, both the traverse speed and the RPM of the auger could be varied to cause the desired weight to be dispensed.

The specific process for calibrating a dispensing system will now be described. Before dispensing the actual sample to be weighed, the needle of the dispensing system is moved over the sample cup and a small amount is dispensed. This initial dispense may cause a small tail of material to form on the end of the needle. While it is not necessary to perform this initial dispense, in some embodiments, it is desirable to do so, since it may more be more representative of the situation that occurs when multiple dispensing operations occur between calibration cycles. After the initial material is dispensed, the scale is zeroed out. Next, using some initial line width as a starting point (e.g. 120 deg/mm), the full dispensing pattern is dispensed into the sample cup. At the end of the dispensing, a tail of dispensing material may again be formed on the end of the dispensing needle. This tail of material remaining at the end of the sample dispense should be substantially the same as the tail that was established before the sample, and accordingly, the material landing in the cup is substantially equal to the actual amount that flowed through the needle.

The sample is weighed (e.g. 160 mg), and compared to the target weight and tolerance range (e.g. 200 mg±2%). The target weight is divided by the actual weight to determine an adjustment ratio (e.g. 200 mg/160 mg=1.25), and this ratio is multiplied by the line width used during the sample dispense to arrive at a new line width (e.g. 1.25*120 deg/mm=150 deg/mm). The sample weighing and adjustment process is repeated until the sample weight is within the target range. Since the amount of material delivered is very linearly related to the line width, this converging process is typically quick in embodiments of the present invention. Usually the second sample will be within the range, however, in some cases, it may be necessary to make additional passes. Once a line width is found that achieves the desired target weight, the system may move the pump to a "pre-dispense plate" to dispense a programmable pattern of lines or dots on the pre-dispense plate. This pre-dispense pattern may be programmed to be representative of the terminal portion of the actual dispense pattern, particularly with respect to the dispense height and retraction movements, and therefore, the tail remaining on the needle after the pre-dispensing should be the same as that encountered during dispensing on actual parts. The system is then ready to dispense onto actual parts. The frequency of calibration runs can vary in embodiments of the present invention depending upon the accuracy and repeatability desired as well as the type of material being dispensed.

In one embodiment of the present invention, when pattern samples are being dispensed into the weighing cup, a special scaling algorithm is used to keep the needle over the cup. This algorithm is particularly useful for large dispensing patterns. For large patterns, without the scaling provided in embodiments of the present invention, the extent of movement during the pattern (e.g. 25 mm) would typically cause the needle to move away from the center of the cup.

In one embodiment, during the calibration dispensing, the original X-Y pattern is scaled down by a factor of 100 (e.g. 25 mm/100=0.25 mm), and the line width is scaled up by the same factor (e.g. 100*150 deg/mm=15000 deg/mm). It can be easily observed that the two scaled factors will cancel each other out, causing the pump to follow the same velocity profile as it would during a non-scaled dispense (e.g. 25 mm*150 deg/mm=3750 deg=0.25 mm*15000 deg/mm). The line width may be scaled by either increasing the RPM of the auger pump or reducing the traverse speed of the pump.

This scaling allows the sample dispensing routine to run using the identical code that is used to perform real dispensing. During the calibration routine, the coordination between X-Y movement and dispensing from the pump is maintained, as are all of the starts, stops and acceleration/deceleration profiles. Accordingly, the non-linearities associated with the starting and stopping of the pump and the gantry motors are accounted for during the calibration routine to provide a more accurate calibration and control routine. In other embodiments of the invention, rather than scale the movement and the speed of the pump during a calibration routine, the dispensing pump is controlled to follow the same dispensing pattern that is used to dispense on substrates (e.g., the same acceleration and deceleration profiles) while the pump is held in a fixed position over the weigh scale.

In the embodiments described above, a scaling algorithm is used to allow the full dispensing pattern of the pump to be run during a weight calibration. In other embodiments of the present invention, the scaling algorithm and full pattern calibration dispensing technique may be used with dispensing systems having other measurement devices, such as a volumetric measurement device, that provide calibration based on the volume of material dispensed, such as the dispensing systems described in U.S. Pat. No. 6,112,588, assigned to the assignee of the present invention and incorporated herein by reference.

In embodiments of the present invention described above, operation of components of the dispensing system is controlled by a system controller. In other embodiments, some or all of the functions of the system controller may be distributed among the various components of the dispensing system. For example, an intelligent weigh scale may be used having processing capabilities contained therein for comparing a measured amount with a target amount and outputting a signal indicative of a difference between the measured and target amounts.

In embodiments of the present invention discussed above and in the claims, the term weight scale is used to refer to a device for determining the weight of material dispensed. The term weight scale is intended to include both weight scales and balances that are used to measure weight and/or mass of material.

Having thus described at least one illustrative embodiment of the invention, various alterations, modifications and improvements will readily occur to those skilled in the art. Such alterations, modifications and improvements are intended to be within the scope and spirit of the invention.

Accordingly, the foregoing description is by way of example only and is not intended as limiting. The invention's limit is defined only in the following claims and the equivalents thereto.

What is claimed is:

1. A method of calibrating a dispensing system that dispenses material onto a substrate according to a predetermined pattern, the dispensing system having a dispensing pump that dispenses material and a gantry system that controls movement of the pump over the substrate and over a calibration system, the method comprising steps of:

(a) moving the pump over the calibration system;
    (b) dispensing a quantity of material from the pump while the pump is moved by the gantry system according to a calibration pattern that is representative of the predetermined pattern;
    (c) determining the quantity of material dispensed;
    (d) comparing the quantity of material dispensed with a target quantity; and
    (e) adjusting characteristics of the dispensing system when a difference between the quantity of material dispensed and the target quantity is greater than a predetermined tolerance.

2. The method of claim 1, wherein steps (a) through (e) are repeated prior to dispensing on a substrate until the difference is less than the tolerance.

3. The method of claim 2, further comprising a step of applying a scaling factor to the predetermined pattern to reduce the distance traveled by the pump to maintain the pump over the calibration system during a calibration routine.

4. The method of claim 3, wherein the scaling factor is applied to the gantry system to reduce the speed of movement of the pump during a calibration routine such that the material dispensed during a calibration routine is substantially the same as that dispensed onto a substrate.

5. The method of claim 1, further comprising a step of applying a scaling factor to the predetermined pattern to reduce the distance traveled by the pump to maintain the pump over the calibration system during a calibration routine.

6. The method of claim 5, further comprising a step of applying the scaling factor to the gantry system to reduce the speed of movement of the pump during a calibration routine such that the material dispensed during a calibration routine is substantially the same as that dispensed onto a substrate.

7. A method of calibrating a dispensing system that dispenses material onto a substrate according to a predetermined pattern, the dispensing system having a dispensing pump that dispenses material and a gantry system that controls movement of the pump over the substrate and over a calibration system, the method comprising steps of:

(a) moving the pump over the calibration system;
    (b) dispensing a quantity of material from the pump while the pump is positioned over the calibration system and the pump is controlled to follow a dispensing calibration velocity and volume profile that is representative of a dispensing velocity and volume profile of the pump for the predetermined pattern;
    (c) determining the quantity of material dispensed;
    (d) comparing the quantity of material dispensed with a target quantity; and
    (e) adjusting characteristics of the dispensing system when a difference between the quantity of material dispensed and the target quantity is greater than a predetermined tolerance.

8. The method of claim 7, wherein steps (a) through (e) are repeated prior to dispensing on a substrate until the difference is less than the tolerance.

* * * * *